(12) United States Patent
Ramdani et al.

(10) Patent No.: US 6,392,257 B1
(45) Date of Patent: May 21, 2002

(54) SEMICONDUCTOR STRUCTURE, SEMICONDUCTOR DEVICE, COMMUNICATING DEVICE, INTEGRATED CIRCUIT, AND PROCESS FOR FABRICATING THE SAME

(75) Inventors: Jamal Ramdani, Gilbert; Ravindranath Droopad; Lyndee L. Hilt, both of Chandler; Kurt William Eisenbeiser, Tempe, all of AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/502,023

(22) Filed: Feb. 10, 2000

(51) Int. Cl.[7] .......................... H01L 29/04; H01L 29/12
(52) U.S. Cl. ...................... 257/190; 257/200; 257/201; 257/627
(58) Field of Search ................................. 257/200, 201, 257/190, 627

(56) References Cited

U.S. PATENT DOCUMENTS

| | | | |
|---|---|---|---|
| 3,802,967 A | 4/1974 | Landany et al. | 148/171 |
| 4,174,422 A | 11/1979 | Matthews et al. | |
| 4,404,265 A | 9/1983 | Manasevit | 428/689 |
| 4,482,906 A | 11/1984 | Hovel et al. | 357/16 |
| 4,523,211 A | 6/1985 | Morimoto et al. | |
| 4,661,176 A | 4/1987 | Manasevit | |
| 4,793,872 A | 12/1988 | Meunier et al. | |
| 4,846,926 A | 7/1989 | Kay et al. | 156/612 |
| 4,855,249 A | 8/1989 | Akasaki et al. | |
| 4,882,300 A | 11/1989 | Inoue et al. | 437/236 |
| 4,891,091 A | 1/1990 | Shastry | 156/606 |
| 4,912,087 A | 3/1990 | Aslam et al. | |
| 4,928,154 A | 5/1990 | Umeno et al. | 357/16 |
| 4,963,949 A | 10/1990 | Wanlass et al. | 357/16 |
| 4,999,842 A | 3/1991 | Huang et al. | 372/45 |
| 5,141,894 A | 8/1992 | Bisaro et al. | 437/132 |
| 5,155,658 A | 10/1992 | Inam et al. | 361/321 |
| 5,159,413 A | 10/1992 | Calviello et al. | 505/1 |

(List continued on next page.)

FOREIGN PATENT DOCUMENTS

| | | |
|---|---|---|
| EP | 0342937 | 11/1989 |
| EP | 0455526 | 6/1991 |
| EP | 0250171 | 11/1992 |

(List continued on next page.)

OTHER PUBLICATIONS

"Formation of Si Epi./MgO–Al$_2$O$_3$ Epi./SiO$_3$/Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction and Regrowth Control of CeO$_2$ on Si(111) Surface for the Silicon–On–Insulator Structure," T. Chikyow et al., Appl. Phys. Lett. 65(8), Aug. 22, 1994, pp. 1030–1032.

(List continued on next page.)

Primary Examiner—Jerome Jackson, Jr.
(74) Attorney, Agent, or Firm—Oblon, Spivak, McClelland, Maier & Neustadt, P.C.

(57) ABSTRACT

High quality epitaxial layers of compound semiconductor materials can be grown overlying large silicon wafers by first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline compound semiconductor layer. Any lattice mismatch between the accommodating buffer layer and the underlying silicon substrate is taken care of by the amorphous interface layer.

6 Claims, 8 Drawing Sheets

U.S. PATENT DOCUMENTS

| | | | |
|---|---|---|---|
| 5,221,367 A | 6/1993 | Chisholm et al. | 148/33 |
| 5,225,031 A | 7/1993 | McKee et al. | 156/612 |
| 5,248,564 A | 9/1993 | Ramesh et al. | 428/688 |
| 5,270,298 A | 12/1993 | Ramesh et al. | 505/1 |
| 5,310,707 A | 5/1994 | Oishi et al. | 501/126 |
| 5,326,721 A | 7/1994 | Summerfelt | 437/131 |
| 5,358,925 A | 10/1994 | Connell et al. | |
| 5,393,352 A | 2/1995 | Summerfelt | |
| 5,418,216 A | 5/1995 | Fork | |
| 5,418,389 A | 5/1995 | Watanabe | 257/295 |
| 5,450,812 A | 9/1995 | McKee et al. | |
| 5,478,653 A | 12/1995 | Guenzer | |
| 5,482,003 A | 1/1996 | McKee et al. | |
| 5,484,664 A * | 1/1996 | Kitahara | 257/200 |
| 5,514,484 A | 5/1996 | Nashimoto | |
| 5,556,463 A | 9/1996 | Guenzer | 117/90 |
| 5,588,995 A | 12/1996 | Sheldon | |
| 5,670,798 A | 9/1997 | Schetzina | 257/96 |
| 5,674,366 A | 10/1997 | Hayashi et al. | 204/298.09 |
| 5,731,220 A | 3/1998 | Tsu et al. | 437/60 |
| 5,733,641 A | 3/1998 | Fork et al. | |
| 5,735,949 A | 4/1998 | Mantl et al. | 117/8 |
| 5,741,724 A | 4/1998 | Ramdani et al. | 437/128 |
| 5,801,105 A | 9/1998 | Yano et al. | 438/785 |
| 5,810,923 A | 9/1998 | Yano et al. | 117/84 |
| 5,828,080 A | 10/1998 | Yano et al. | 257/43 |
| 5,830,270 A | 11/1998 | McKee et al. | |
| 5,874,860 A | 2/1999 | Brunel et al. | 330/285 |
| 5,912,068 A | 6/1999 | Jia | |
| 6,002,375 A | 12/1999 | Corman et al. | 343/853 |
| 6,020,222 A | 2/2000 | Wollesen | |
| 6,045,626 A | 4/2000 | Yano et al. | 148/33.4 |
| 6,055,179 A | 4/2000 | Koganei et al. | 365/158 |
| 6,064,078 A | 5/2000 | Northrup et al. | 257/96 |
| 6,064,092 A | 5/2000 | Park | |
| 6,096,584 A | 8/2000 | Ellis-Monaghan et al. | |
| 6,103,008 A | 8/2000 | McKee et al. | 117/2 |
| 6,107,653 A | 8/2000 | Fitzgerald | 257/191 |
| 6,113,690 A | 9/2000 | Yu et al. | 117/84 |
| 6,136,666 A | 10/2000 | So | |
| 6,143,072 A | 11/2000 | McKee et al. | 117/8 |
| 6,173,474 B1 | 1/2001 | Conrad | |
| 6,174,755 B1 | 1/2001 | Manning | |
| 6,180,486 B1 | 1/2001 | Leobandung et al. | |

FOREIGN PATENT DOCUMENTS

| | | |
|---|---|---|
| EP | 0514018 | 11/1992 |
| EP | 0602568 | 6/1994 |
| EP | 0607435 | 7/1994 |
| EP | 0999600 | 5/2000 |
| EP | 1001468 | 5/2000 |
| GB | 1319311 | 6/1973 |
| JP | 5208835 | 7/1977 |
| JP | 5413455 | 10/1979 |
| JP | 5508742 | 7/1980 |
| JP | 6110818 | 5/1986 |
| JP | 6303499 | 2/1988 |
| JP | 6313110 | 6/1988 |
| JP | 6319836 | 8/1988 |
| JP | 6327862 | 1/1990 |
| JP | 5048072 | 2/1993 |
| JP | 6334168 | 6/1993 |
| JP | 6232126 | 8/1994 |
| JP | 6291299 | 10/1994 |
| JP | 1123868 | 8/1999 |
| JP | 1126083 | 9/1999 |
| JP | 2000039 | 1/2000 |
| WO | 9914804 | 3/1999 |
| WO | 9963580 | 12/1999 |

OTHER PUBLICATIONS

"Epitaxial Growth of CeO$_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry), " Talus Corporation, Qualcomm QCP–800 Technical Analysis Report, Dec. 10, 1996, pp. 5–8.

"Integration of GaAs on Si using a spinel buffer layer, IBM Technical Bulletin," vol. 30, No. 6, Nov. 1987, p. 365.

"GaInAs Superconducting FET," IBM Technical Bulletin, vol. 36, No. 8, Aug. 1993, p. 655.

"Epitaxial 3d Structure Using Mixed Spinel," IBM Technical Bulletin, vol. 30, No. 3, Aug. 1987, p. 1271.

"Roles of Buffer Layers in Epitaxial Growth of SrTiO$_3$ Films on Silicon Substrates,"Moon et al., Japan J of Appl Phys., vol. 33, 1994. pp 1472–1477.

"GaAs Heteroepitaxial Growth on Si Substrates with Thin Si Interlayers in Situ Annealed at High Temperatures," Yodo et al., 8257b Journal of Vacuum Science & Technology, 1995, No. 3, pp. 1000–1005.

"Substrate Effect on the Superconductivity of Yba$_2$Cu$_3$O$_7$ Thin Films," Cuomo et al., AIP conference 1988, pp. 141–148.

"Crystalline Oxides on Silicon: The First Five Monolayers," McKee et al., Physical Review Letters, vol. 81, No. 14, Oct. 1998, pp. 3014–3017.

"Molecular Beam Epitaxy Growth of Epitaxial Barium Silicide, Barium Oxide, and Barium Titanate on Silicon," McKee et al., 1991 American Institute of Physics, pp. 782–284.

"Molecular Beam Epitaxy Growth of SrTiO$_3$ Films on Si(100)–2×1 with SrO Buffer Layer," Tambo et al., Jpn. J. Appl. Phys., vol. 37, 1998 pp. 4454–4459.

"The MBE Growth and Optical Quality of BaTiO$_3$ and SrTiO$_3$ Thin Films on MgO," McKee et al., Mat. Res. Soc. Symp. Proc. vol. 341, 1994, pp. 309–314.

"BaSi$_2$ and Thin Film Alkaline Earth Silicides on Silicon," McKee et al., Appl. Phys. Lett. 63 (20), Nov. 1993, pp. 2818–2820.

"Surface Structures and the Orthorhombic Transformation of Thin Film BaSi$_2$ on Silicon," McKee et al., Mat. Res. Soc. Symp. Proc. vol. 221, pp. 131–136.

"Epitaxial Growth of of SrTiO$_3$ Films on Si(100) Substrates Using a Focused Electron Beam Evaporation Method," Mori et al. Jpn. J. of Appl. Phys., vol. 30, No. 8a, Aug. 1991, pp. 1415–1417.

"Growth of Crystalline SrTiO$_3$ Films on Si Substrates Using Thin Fluoride Buffer Layers and Their Electrical Properties," Moon et al., Jpn. J. of Apl. Phys., vol. 33, (1994), pp. 5911–5916.

"Heteroepitaxy of Dissmilar Materials," Mat. Res. Soc. Symposium Proceedings, vol. 221, pp. 29–34.

"Heteroepitaxy on Silicon: Fundametnals, Structure and Devices," Mat. Res. Soc. Symposium Proceedings, vol. 116, pp. 369–374.

"A Preliminary Consideration of the Growth Behavior of CeO$_2$, SrTiO$_3$ and SrVO$_3$ Films on Si Substrate," Nagata et al., Thin Solid Films, 224, 1993, pp. 1–3.

"Heteroepitaxial Growth of CeO$_2$(001) Films on Si(001) Substrates by Pulsed Laser Deposition in Ultrahigh Vacuum," Nagata et al., Jpn. J. Appl. Phys., vol. 30, No. 6b, 1991, pp. 1136–1138.

"Heteroepitaxial Growth of SrO Films on Si Substrates," Kado et al., J. Appl. Phys., 61(6), 1987, pp. 2398–2400.

"Silicon Molecular Beam Epitaxy," Materials Research Symposium Proceedings, vol. 220, pp. 595–600.

"Effects of Buffer Layers in Epitaxial Growth of SrTiO$_3$ Thin Film on Si(100)," Nakagawara et al., J. Appl. Phys. 78(12), 1995, pp.7226–7230.

"A Proposal of Epitaxial Oxide Thin Film Structures for Future Oxide Electronics," Suzuki et al., Materials Science and Engineering B41 (1996), pp. 166–173.

"Optimizing GMR Spin Valves: The Outlook for Improved Properties", W.F. Englhoff et al., 1998 Int'l Non Volatile Memory Technology Conference. pp. 34–37.

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acousto–optic applications", M. Rotter et al., 1997 American Institute of Physics, pp. 2097–2099.

"Surface Acoustic Wave Propagation in PZT/YBCO/SrTiO$_3$ and PbTiO$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

"Properties of GaAs Si Grown by Molecular Beam Epitaxy, "R. Houdre et al., Solid State and Molecular Sciences, 1990, pp. 91–114.

"Gallium Arsenide and Other Compound Semiconductors on Silicon," S.F. Fang et al., J. Appl. Phys. 68(7), Oct. 1, 1990, pp. R31–R58.

"Impact of GaAs Buffer Thickness on electronic Quality of GaAs Grown on Graded Ge/GeSi/Si Substrates," Carlin et al., Appl. Phys. Letter, vol. 76, No. 14, Apr. 2000, pp. 1884–1886.

"Epitaxial Integration of III–V Materials and Devices with Si Using Graded GeSi Buffers," Ringel et al., 27th International Symposium on Compound Semiconductors, Oct. 2000.

"Progress in Compound–Semiconductor–on–Silicon–Heteroepitaxy with Fluoride Buffer Layers," Zogg et al., J. Electrochem Soc., vol. 136, No. 3, Mar. 1989, pp. 775–779.

"Oxide Defined GaAs Vertical–Cavity Surface–Emitting Lasers on Si Substrates," Xiong et al., IEEE Photonics Tech Letters, vol. 12, No. 2, Feb. 2000, pp. 110–112.

"Investigation of PZT/?LSCO/PT//Aerogel Thin Film Composites for Uncooled Pyroelectric IR Detectors," Clem et al., Mat. Res. Soc. Symp. vol. 541, pp. 661–666.

"Bound–To–Quasi–Bound Quantum–Well Infrared Photodetectors," Gunapala et al., NASA Tech Brief, vol. 22, No. 9.

"Photodetectors: Materials and Devices II," Brown et al., Intn. Society for Optical Engineering, vol. 2999, pp. 211–224.

"Nanostructure and Chemistry of a (100)Mg)/(100)GaAs Interface," Bruley et al., Appl. Phys Lett. 65(5), Aug. 1994, pp. 564–566.

"Epitaxial MgO on Si(001) for Y–Ba–Cu–O Thin Film Growth by Pulsed Laser Deposition," Fork et al., Appl. Phys Lett 58(20), May 1991, pp. 2294–2296.

"Dialectrics on Semiconductors," Himpsel et al., Materials Science and Engineering, B1(1988), pp. 9–13.

"Epitaxial La 0.67 Sr 0.33 MnO$_3$ Magnetic Tunnel Junctions," J. Appl. Phys. 81(8), Apr. 1997 pp. 5509–5511.

"Colossal Magnetoresistance Magnetic Tunnel Junctions Grown by Molecular–Beam Epitaxy," O'Donnell et al., Appl. Physics Letters, bol. 76, No. 14, Apr. 2000, pp. 1914–1916.

* cited by examiner

US 6,392,257 B1

SEMICONDUCTOR STRUCTURE, SEMICONDUCTOR DEVICE, COMMUNICATING DEVICE, INTEGRATED CIRCUIT, AND PROCESS FOR FABRICATING THE SAME

CROSS REFERENCE TO RELATED APPLICATION

The present application is related to U.S. patent application Ser. No. 09/273929 entitled "Method for Fabricating a Semiconductor Structure Having a Crystalline Alkaline Earth Metal Oxide Interface with Silicon," filed Mar. 22, 1999, U.S. patent application No. 09/274268 entitled "Semiconductor Structure Having a Crystalline Alkaline Earth Metal Oxide Interface with Silicon," filed Mar. 22, 1999, entitled "Semiconductor Substrate and Method for Preparing the Same," filed concurrently herewith, all of which are assigned to the current assignee hereof.

FIELD OF THE INVENTION

This invention relates generally to semiconductor structures and devices and to a method for their fabrication, and more specifically to compound semiconductor structures and devices and to the fabrication and use of semiconductor structures, devices, and integrated circuits that include a monocrystalline compound semiconductor material.

BACKGROUND OF THE INVENTION

The vast majority of semiconductor discrete devices and integrated circuits are fabricated from silicon, at least in part because of the availability of inexpensive, high quality monocrystalline silicon substrates. Other semiconductor materials, such as the so called compound semiconductor materials, have physical attributes, including wider bandgap and/or higher mobility than silicon, or direct bandgaps that makes these materials advantageous for certain types of semiconductor devices. Unfortunately, compound semiconductor materials are generally much more expensive than silicon and are not available in large wafers as is silicon. Gallium arsenide (GaAs), the most readily available compound semiconductor material, is available in wafers only up to about 150 millimeters (mm) in diameter. In contrast, silicon wafers are available up to about 300 mm and are widely available at 200 mm. The 150 mm GaAs wafers are many times more expensive than are their silicon counterparts. Wafers of other compound semiconductor materials are even less available and are more expensive than GaAs.

Because of the desirable characteristics of compound semiconductor materials, and because of their present generally high cost and low availability in bulk form, for many years attempts have been made to grow thin films of the compound semiconductor materials on a foreign substrate. To achieve optimal characteristics of the compound semiconductor material, however, a monocrystalline film of high crystalline quality is desired. Attempts have been made, for example, to grow layers of a monocrystalline compound semiconductor material on germanium, silicon, and various insulators. These attempts have generally been unsuccessful because lattice mismatches between the host crystal and the grown crystal have caused the resulting thin film of compound semiconductor material to be of low crystalline quality.

If a large area thin film of high quality monocrystalline compound semiconductor material was available at low cost, a variety of semiconductor devices could advantageously be fabricated in that film at a low cost compared to the cost of fabricating such devices on a bulk wafer of compound semiconductor material or in an epitaxial film of such material on a bulk wafer of compound semiconductor material. In addition, if a thin film of high quality monocrystalline compound semiconductor material could be realized on a bulk wafer such as a silicon wafer, an integrated device structure could be achieved that took advantage of the best properties of both the silicon and the compound semiconductor material.

Accordingly, a need exists for a semiconductor structure that provides a high quality monocrystalline compound semiconductor film over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
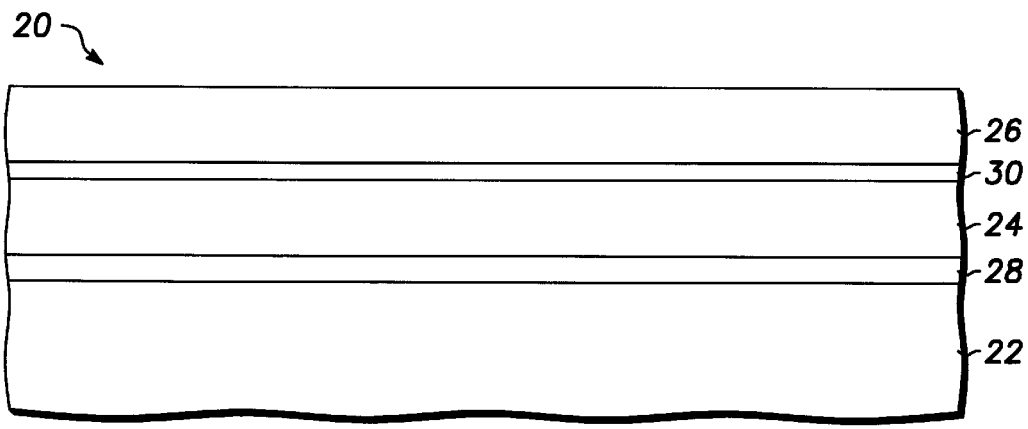
FIGS. 1, 2, 4, 5 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and compound semiconductor layer 26. As will be explained more fully below, the template layer helps to initiate the growth of the compound semiconductor layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constants refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with the underlying substrate and with the overlying compound semiconductor material. For example, the material could be an oxide or nitride having a lattice structure matched to the substrate and to the subsequently applied semiconductor material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:
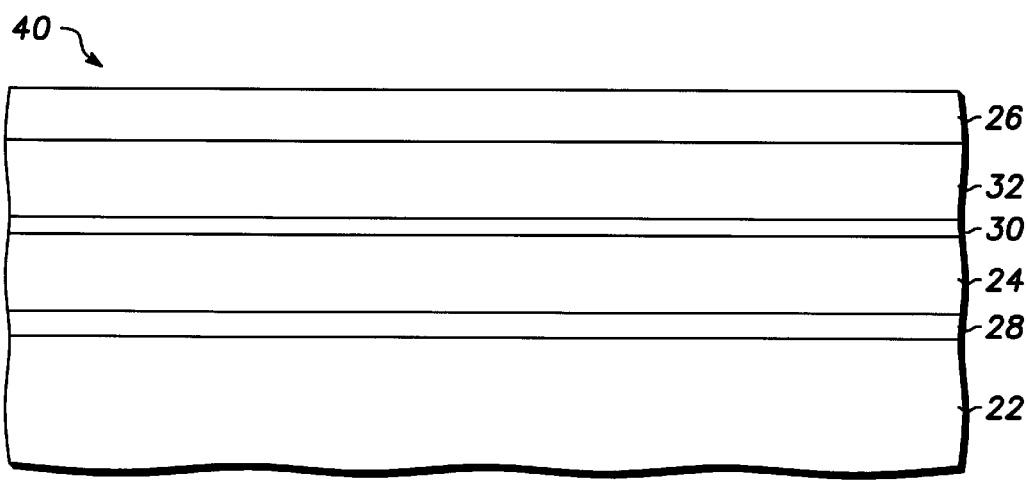

FIG. 2 illustrates, in cross section, a portion of a semiconductor structure 40 in accordance with a further embodiment of the invention. Structure 40 is similar to the previously described semiconductor structure 20 except that an additional buffer layer 32 is positioned between accommodating buffer layer 24 and layer of monocrystalline compound semiconductor material 26. Specifically, the additional buffer layer is positioned between the template layer 30 and the overlying layer of compound semiconductor material. The additional buffer layer, formed of a semiconductor or compound semiconductor material, serves to provide a lattice compensation when the lattice constant of the accommodating buffer layer cannot be adequately matched to the overlying monocrystalline compound semiconductor material layer.

The following non-limiting, illustrative examples illustrate various combinations of materials useful in structure 20 and structure 40 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, compound semiconductor material layer 26 is a layer of gallium arsenide (GaAs) or aluminum gallium arsenide (AlGaAs) having a thickness of about 1 nm to about 100 micrometers ($\mu$m) and preferably a thickness of about 0.5

μm to 10 μm. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of compound semiconductor materials in the indium phosphide (InP) system. The compound semiconductor material can be, for example, indium phosphide (InP) or indium gallium arsenide (InGaAs) having a thickness of about 1.0 nm to 10 μm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, strontium-sulfur (Sr—S) followed by the ZnSeS.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a gallium arsenide phosphide ($GaAs_xP_{1-x}$) or indium gallium phosphide ($In_yGa_{1-y}P$) strain compensated superlattice. In the gallium arsenide phosphide superlattice the value of x ranges from 0 to 1, and in the indium gallium phosphide superlattice the value of y ranges from 0 to 1. By so varying the value of x or y, as the case may be, the lattice constant is varied from bottom to top across the superlattice to create a match between lattice constants of the underlying oxide and the overlying compound semiconductor material. The superlattice can have a thickness of about 50–500 nm and preferably has a thickness of about 200–100 nm. The template for this structure can be the same of that described in example 1. Alternatively, the buffer layer can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between the accommodating buffer layer and the overlying monocrystalline compound semiconductor material layer. The buffer layer, a further monocrystalline semiconductor material, can be, for example, a graded layer of indium gallium arsenide (InGaAs) in which the indium composition varies from 0 to about 47%. The buffer layer preferably has a thickness of about 10–30 nm. Varying the composition of the buffer layer from GaAs to InGaAs serves to provide a lattice match between the underlying monocrystalline oxide material and the overlying layer of monocrystalline compound semiconductor material. Such a buffer layer is especially advantageous if there is a lattice mismatch between accommodating buffer layer 24 and monocrystalline compound semiconductor material layer 26.

Referring again to FIGS. 1 and 2, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 3:
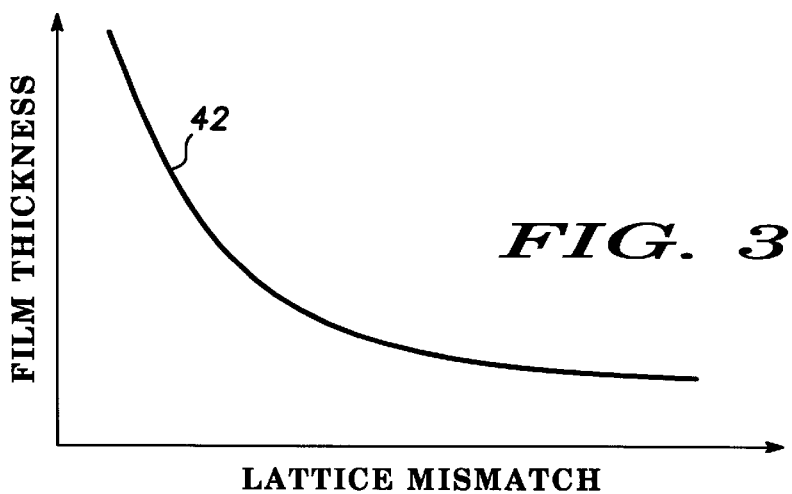
FIG. 3 illustrates graphically the relationship between maximum attainable film thickness and lattice mismatch between a host crystal and a grown crystalline overlayer.

FIG. 3 illustrates graphically the relationship of the achievable thickness of a grown crystal layer of high so crystalline quality as a function of the mismatch between the lattice constants of the host crystal and the grown crystal. Curve 42 illustrates the boundary of high crystalline quality material. The area to the right of curve 42 represents layers that tend to be polycrystalline. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 24, a silicon oxide layer in this example, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1 and 2, layer 26 is a layer of epitaxially grown monocrystalline compound semiconductor material and that crystalline material is also characterized by a crystal lattice constant and a crystal orientation. To achieve high crystalline quality in this epitaxially grown layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. If the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown compound semiconductor layer can be used to reduce strain in the grown monocrystalline compound semiconductor layer that might result from small differences in lattice constants. Better crystalline quality in the grown monocrystalline compound semiconductor layer can thereby be achieved.

The following example illustrates a process, in accordance with one embodiment of the invention, for fabricating a semiconductor structure such as the structures depicted in FIGS. 1 and 2. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 0.50° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE). The native oxide can be removed by first thermally depositing a thin layer of strontium in an MBE apparatus. The substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing strontium oxide onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 400–600° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric (100) strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing (100) strontium titanate layer. The growth of the silicon oxide layer results from the diffusion of oxygen through the growing strontium titanate layer to the interface where the oxygen reacts with silicon at the surface of the underlying substrate. The (100) strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired compound semiconductor material. For the subsequent growth of a layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is introduced to the reaction with the arsenic and gallium arsenide forms. Alternatively, gallium can be deposited on the capping layer to form a Sr—O—Ga bond, and arsenic is introduced with the gallium to form the GaAs.

The structure illustrated in FIG. 2 can be formed by the process discussed above with the addition of an additional buffer layer deposition step. The buffer layer is formed overlying the template layer before the deposition of the monocrystalline compound semiconductor layer. If the buffer layer is a compound semiconductor superlattice, such a superlattice can be deposited, by MBE for example, on the template described above. If instead the buffer layer is a layer of germanium, the process above is modified to cap the strontium titanate monocrystalline layer with a final layer of either strontium or titanium and then by depositing germanium to react with the strontium or titanium. The germanium buffer layer can then be deposited directly on this template.

The process described above illustrates a process for forming a semiconductor structure including a silicon substrate, a monocrystalline strontium titanate accommodating buffer layer, and a monocrystalline gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers can be deposited overlying the monocrystalline oxide accommodating buffer layer.

Each of the variations of compound semiconductor materials and monocrystalline oxide accommodating buffer layer uses an appropriate template for initiating the grown of the compound semiconductor layer. For example, if the accommodating buffer layer is alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a compound semiconductor material layer comprising indium gallium arsenide, indium aluminum arsenide, or indium phosphide.

Figure 4:
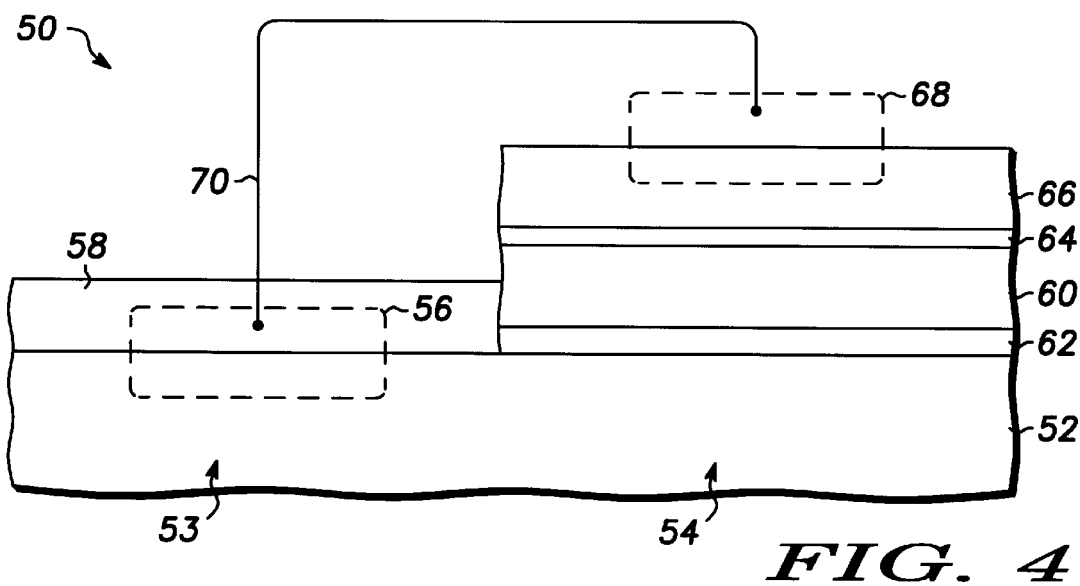

FIG. 4 illustrates schematically, in cross section, a device structure 50 in accordance with a further embodiment of the invention. Device structure 50 includes a monocrystalline semiconductor substrate 52, preferably a monocrystalline silicon wafer. Monocrystalline semiconductor substrate 52 includes two regions, 53 and 54. An electrical semiconductor component generally indicated by the dashed line 56 is formed in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 58 such as a layer of silicon dioxide or the like may overlie electrical semiconductor component 56.

Insulating material 58 and any other layers that may have been formed or deposited during the processing of semiconductor component 56 in region 53 are removed from the surface of region 54 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 54 and is reacted with the oxidized surface to form a first template layer (not shown). In accordance with one embodiment of the invention a monocrystalline oxide layer 60 is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer 60. The partial pressure of oxygen is then increased to provide an overpressure of oxygen and to allow oxygen to diffuse through the growing monocrystalline oxide layer. The oxygen diffusing through the barium titanate reacts with silicon at the surface of region 54 to form an amorphous layer 62 of silicon oxide on the second region and at the interface between the silicon substrate and the monocrystalline oxide.

In accordance with an embodiment of the invention, the step of depositing monocrystalline oxide layer 60 is terminated by depositing a second template layer 64, which can be 1–10 monolayers of titanium, barium, barium and oxygen, or titanium and oxygen. A layer 66 of a monocrystalline compound semiconductor material is then deposited overlying the second template layer by a process of molecular beam epitaxy. The deposition of layer 66 is initiated by depositing a layer of arsenic onto the template. This initial step is followed by depositing gallium and arsenic to form monocrystalline gallium arsenide. Alternatively, strontium can be substituted for barium in the above example.

In accordance with a further embodiment of the invention, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in the silicon substrate and one device formed in the monocrystalline compound semiconductor material layer. Although illustrative structure 50 has been described as a structure formed on a silicon substrate 52 and having a barium (or strontium) titanate layer 60 and a gallium arsenide layer 66, similar devices can be fabricated using other substrates, monocrystalline oxide layers and other compound semiconductor layers as described elsewhere in this disclosure.

Figure 5:
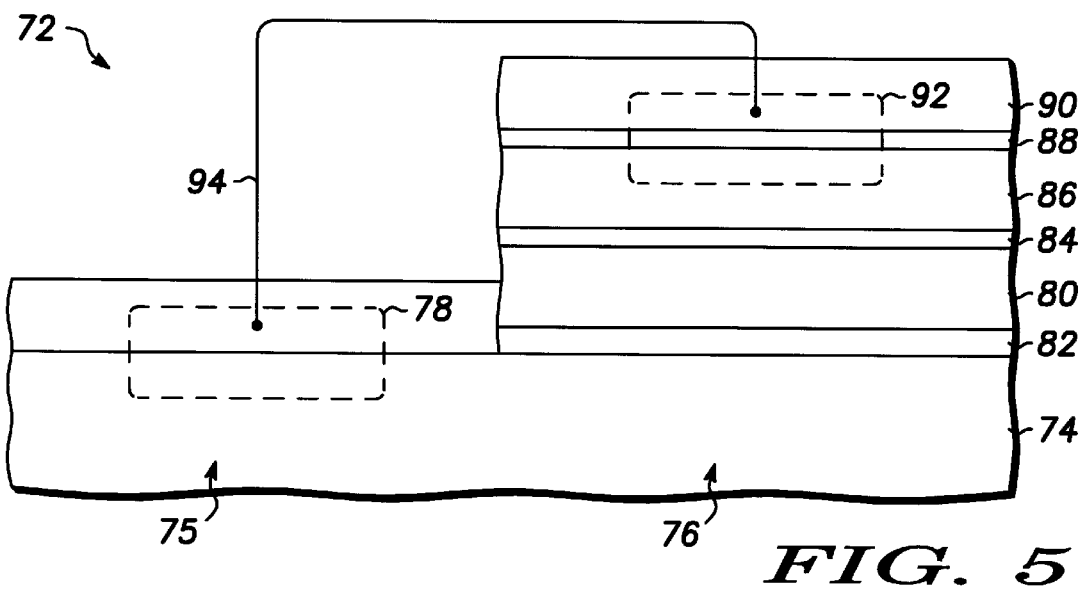

FIG. 5 illustrates a semiconductor structure 72 in accordance with a further embodiment of the invention. Structure 72 includes a monocrystalline semiconductor substrate 74 such as a monocrystalline silicon wafer that includes a region 75 and a region 76. An electrical component schematically illustrated by the dashed line 78 is formed in region 75 using conventional silicon device processing techniques commonly used in the semiconductor industry. Using process steps similar to those described above, a monocrystalline oxide layer 80 and an intermediate amorphous silicon oxide layer 82 are formed overlying region 76 of substrate 74. A template layer 84 and subsequently a monocrystalline semiconductor layer 86 are formed overlying monocrystalline oxide layer 80. In accordance with a further embodiment of the invention, an additional monocrystalline oxide layer 88 is formed overlying layer 86 by process steps similar to those used to form layer 80, and an additional monocrystalline semiconductor layer 90 is formed overlying monocrystalline oxide layer 88 by process steps similar to those used to form layer 86. In accordance with one embodiment of the invention, at least one of layers 86 and 90 are formed from a compound semiconductor material.

A semiconductor component generally indicated by a dashed line 92 is formed at least partially in monocrystalline semiconductor layer 86. In accordance with one embodiment of the invention, semiconductor component 92 may include a field effect transistor having a gate dielectric formed, in part, by monocrystalline oxide layer 88. In addition, monocrystalline semiconductor layer 92 can be used to implement the gate electrode of that field effect transistor. In accordance with one embodiment of the invention, monocrystalline semiconductor layer 86 is formed from a group III–V compound and semiconductor component 92 is a radio frequency amplifier that takes advantage of the high mobility characteristic of group III–V component materials. In accordance with yet a further embodiment of the invention, an electrical interconnection schematically illustrated by the line 94 electrically interconnects component 78 and component 92. Structure 72 thus integrates components that take advantage of the unique properties of the two monocrystalline semiconductor materials.

Figure 6:
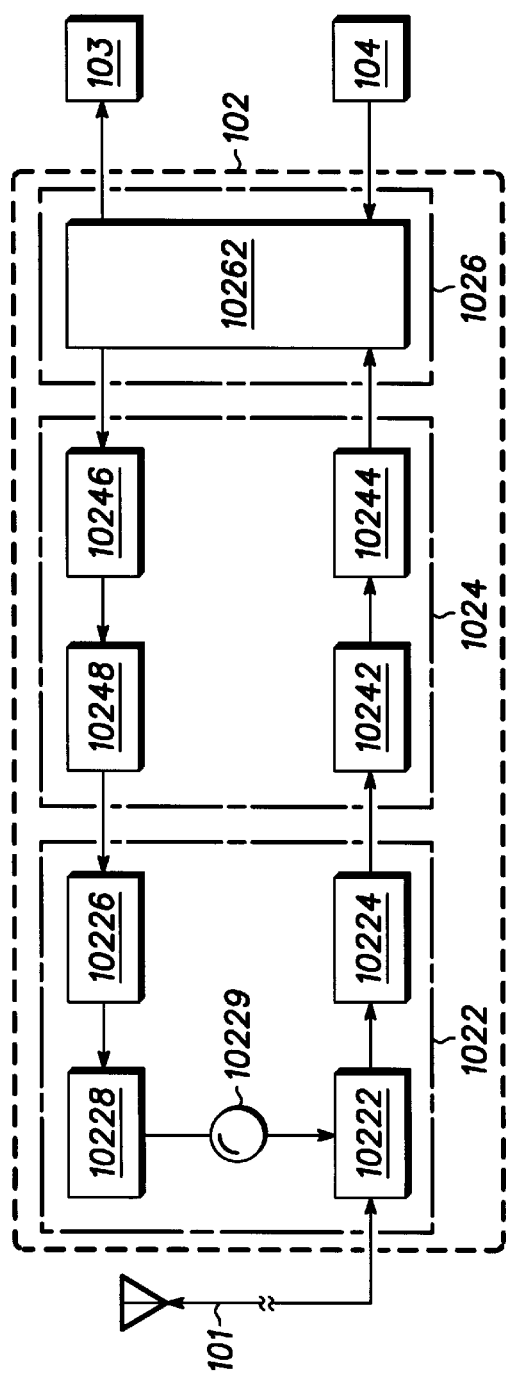
FIG. 6 includes an illustration of a block diagram of a portion of a communicating device.

By way of more specific examples, other integrated circuits and systems are illustrated in FIGS. 6–18. FIG. 6 includes a simplified block diagram illustrating a portion of a communicating device 100 having a signal transceiving means 101, an integrated circuit 102, an output unit 103, and an input unit 104. Examples of the signal transceiving means include an antenna, a modem, or any other means by which information or data can be sent either to or from an external unit. As used herein, transceiving is used to denote that the signal transceiving means may be capable of only receiving, only transmitting, or both receiving and transmitting signals from or to the communicating device. The output unit 103 can include a display, a monitor, a speaker, or the like. The input unit can include a microphone, a keyboard, or the like. Note that in alternative embodiments the output unit 103 and input unit 104 could be replaced by a single unit such as a memory, or the like. The memory can include random access memory or nonvolatile memory, such as a hard disk, a flash memory card or module, or the like.

An integrated circuit is generally a combination of at least two circuit elements (e.g., transistors, diodes, resistors, capacitors, and the like) inseparably associated on or within a continuous substrate. The integrated circuit 102 includes a compound semiconductor portion 1022, a bipolar portion 1024, and an MOS portion 1026. The compound semiconductor portion 1022 includes electrical components that are formed at least partially within a compound semiconductor material. Transistors and other electrical components within the compound semiconductor portion 1022 are capable of processing signals at radio frequencies of at least approximately 0.8 GHz. In other embodiments, the signals could be at lower or higher frequencies. For example, some materials, such as indium gallium arsenide, are capable of processing signals at radio frequency signals at approximately 27 GHz.

The compound semiconductor portion 1022 further includes a duplexer 10222, a radio frequency-to-baseband converter 10224 (demodulating means or demodulating circuit), baseband-to-radio frequency converter 10226 (modulating means or modulating circuit), a power amplifier 10228, and an isolator 10229. The bipolar portion 1024 and the MOS portion 1026 typically are formed in a Group IV semiconductive material. The bipolar portion 1024 includes a receiving amplifier 10242, an analog-to-digital converter 10244, a digital-to-analog converter 10246, and a transmitting amplifier 10248. The MOS portion 1026 includes a digital signal processing means 10262. An example of such means includes any one of the commonly available DSP cores available in the market, such as the Motorola DSP 566xx (from Motorola, Incorporated of Schaumburg, Ill.) and Texas Instruments TMS 320C54x (from Texas Instruments of Dallas, Tex.) families of digital signal processors. This digital signal processing means 10262 typically includes complementary MOS (CMOS) transistors and analog-to-digital and digital-to-analog converters. Clearly, other electrical components are present in the integrated circuit 102.

In one mode of operation, the communicating device 100 receives a signal from an antenna, which is part of the signal transceiving means 101. The signal passes through the duplexer 10227 to the radio frequency-to-baseband converter 10224. The analog data or other information is amplified by receiving amplifier 10224 and transmitted to the digital signal processing means 10262. After the digital signal processing means 10262 has processed the information or other data, the processed information or other data is transmitted to the output unit 103. If the communicating device is a pager, the output unit can be a display. If the communicating device is a cellular telephone, the output unit 103 can include a speaker, a display, or both.

Data or other information can be sent through the communicating device 100 in the opposite direction. The data or other information will come in through the input unit 104. In a cellular telephone, this could include a microphone or a keypad. The information or other data is then processed using the digital signal processing means 10262. After processing, the signal is then converted using the digital-to-analog converter 10246. The converted signal is amplified by the transmitting amplifier 10248. The amplified signal is modulated by the baseband-to-radio frequency converter 10226 and further amplified by power amplifier 10228. The amplified RF signal passes through the isolator 10229 and duplexer 10222 to the antenna.

Prior art embodiments of the communicating device 100 would have at least two separate integrated circuits: one for the compound semiconductor portion 1022 and one for the MOS portion 1026. The bipolar portion 1024 may be on the same integrated circuit as the MOS portion 1026 or could be on still another integrated circuit. With an embodiment of the present invention, all three portions can now be formed within a single integrated circuit. Because all of the transistors can reside on a single integrated circuit, the communicating device can be greatly miniaturized and allow for greater portability of a communicating device.

Figure 7:
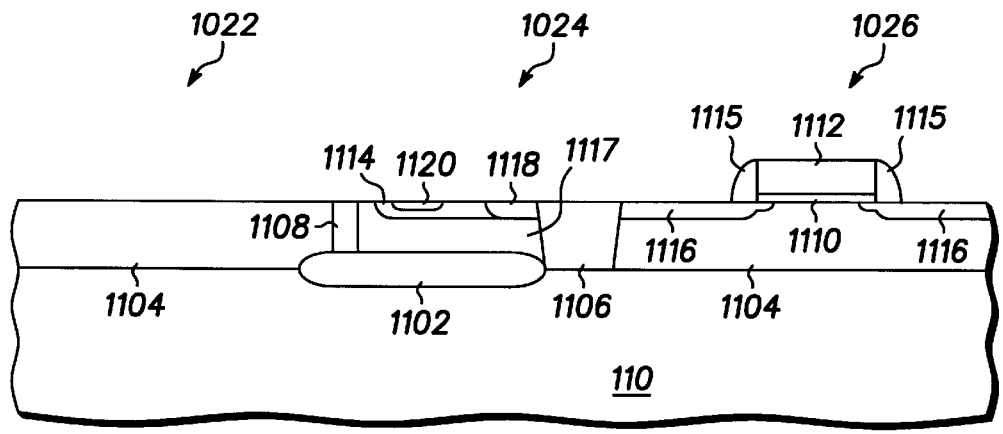
FIGS. 7–11 include illustrations of cross-sectional views of a portion of an integrated circuit that includes a compound semiconductor portion, a bipolar portion, and an MOS portion.

Attention is now directed to a method for forming exemplary portions of the integrated circuit 102 as illustrated in FIGS. 7–11. In FIG. 7, a p-type doped, monocrystalline silicon substrate 110 is provided having a compound semiconductor portion 1022, a bipolar portion 1024, and an MOS portion 1026. Within the bipolar portion, the monocrystalline silicon substrate is doped to form an N$^+$ buried region 1102. A lightly p-type doped epitaxial monocrystalline silicon layer 1104 is then formed over the buried region 1102 and the substrate 110. A doping step is then performed to create a lightly n-type doped drift region 1117 above the N$^+$ buried region 1102. The doping step converts the dopant type of the lightly p-type epitaxial layer within a section of the bipolar region 1024 to a lightly n-type monocrystalline silicon region. A field isolation region 1106 is then formed between the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N$^+$ doped regions 1116 and the emitter region 1120. N$^+$ doped regions 1116 are formed within layer 1104 along adjacent sides of the gate electrode 1112 and are source, drain, or source/drain regions for the MOS transistor. The N$^+$ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P$^+$ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. As of this point, no circuitry has been formed within the compound semiconductor portion 1022.

All of the layers that have been formed during the processing of the bipolar and MOS portions of the integrated circuit are now removed from the surface of compound semiconductor portion 1022. A bare silicon surface is thus provided for the subsequent processing of this portion, for example in the manner set forth above.

Figure 8:
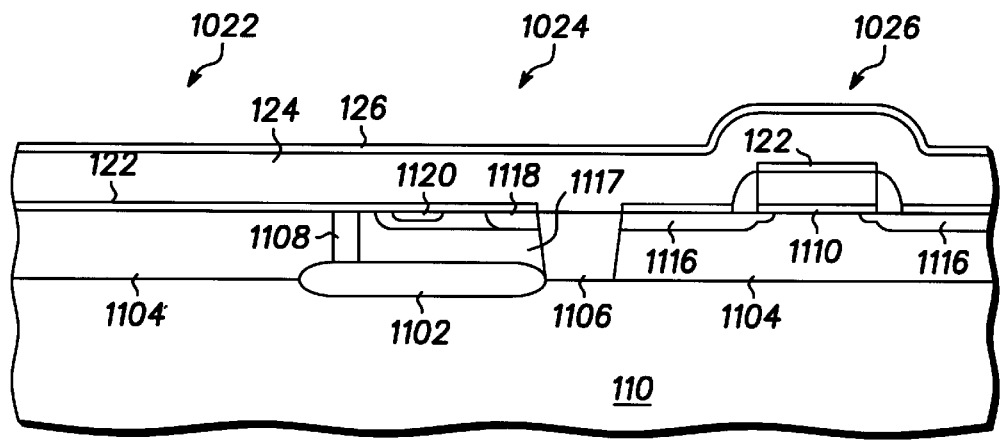

An accommodating buffer layer 124 is then formed over the substrate 110 as illustrated in FIG. 8. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 102. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 126 is then formed and has a thickness in a range of approximately one to ten monolayers of a material. In one particular embodiment, the material includes titanium-arsenic, strontium-oxygen-arsenic, or other similar materials as previously described with respect to FIGS. 1–5.

Figure 9:
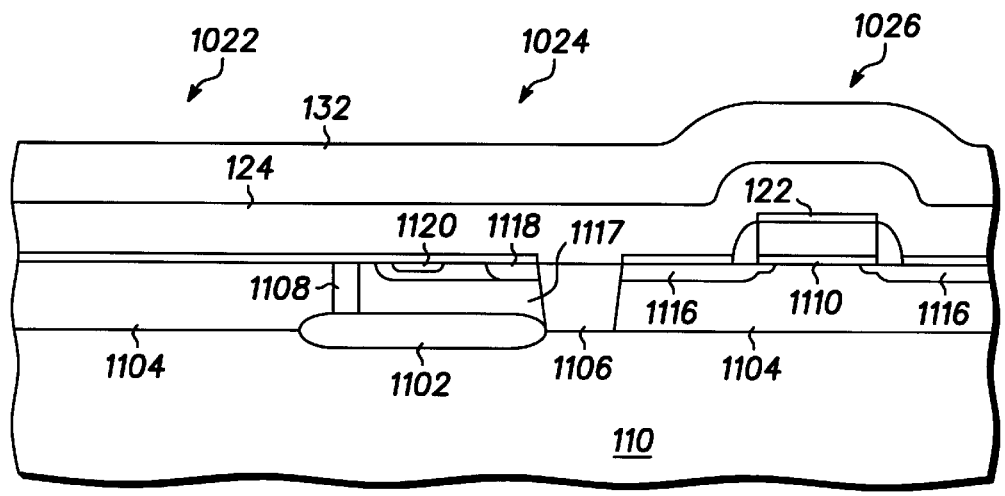

A monocrystalline compound semiconductor layer 132 is then epitaxially grown overlying the monocrystalline portion of accommodating buffer layer 124 as shown in FIG. 9. The portion of layer 132 that is grown over portions of layer 124 that are not monocrystalline may be polycrystalline or amorphous. The monocrystalline compound semiconductor layer can be formed by a number of methods and typically includes a material such as gallium arsenide, aluminum gallium arsenide, indium phosphide, or other compounds semiconductor materials as previously mentioned. The thickness of the layer is in a range of approximately 1–5,000 nm, and more preferably 100–500 nm. In this particular embodiment, each of the elements within the template layer are also present in the accommodating buffer layer 124, the monocrystalline compound semiconductor material 132, or both. Therefore, the delineation between the template layer 126 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

Figure 10:
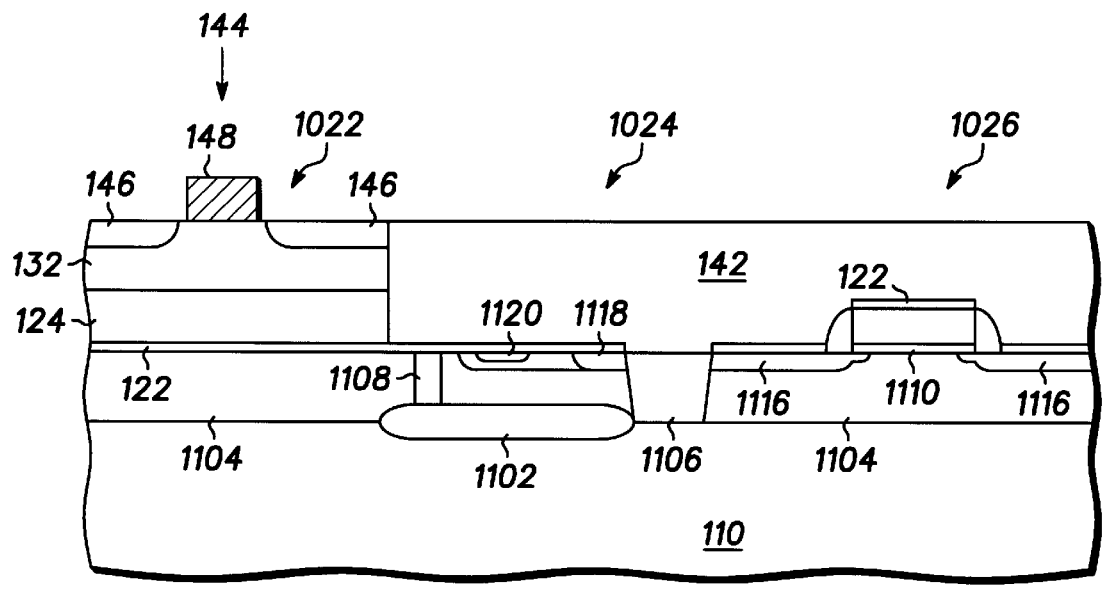

At this point in time, sections of the compound semiconductor layer 132 and the accommodating buffer layer 124 are removed from portions overlying the bipolar portion 1024 and the MOS portion 1026 as shown in FIG. 10. After the section is removed, an insulating layer 142 is then formed over the substrate 110. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished, removing portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and monocrystalline compound semiconductor layer 132 are also n-type doped. If a p-type MESFET were to be formed, then the doped regions 146 and monocrystalline compound semiconductor layer 132 would have just the opposite doping type. The heavier doped ($N^+$) regions 146 allow ohmic contacts to be made to the monocrystalline compound semiconductor layer 132. At this point in time, the active devices within the integrated circuit have been formed. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 11:
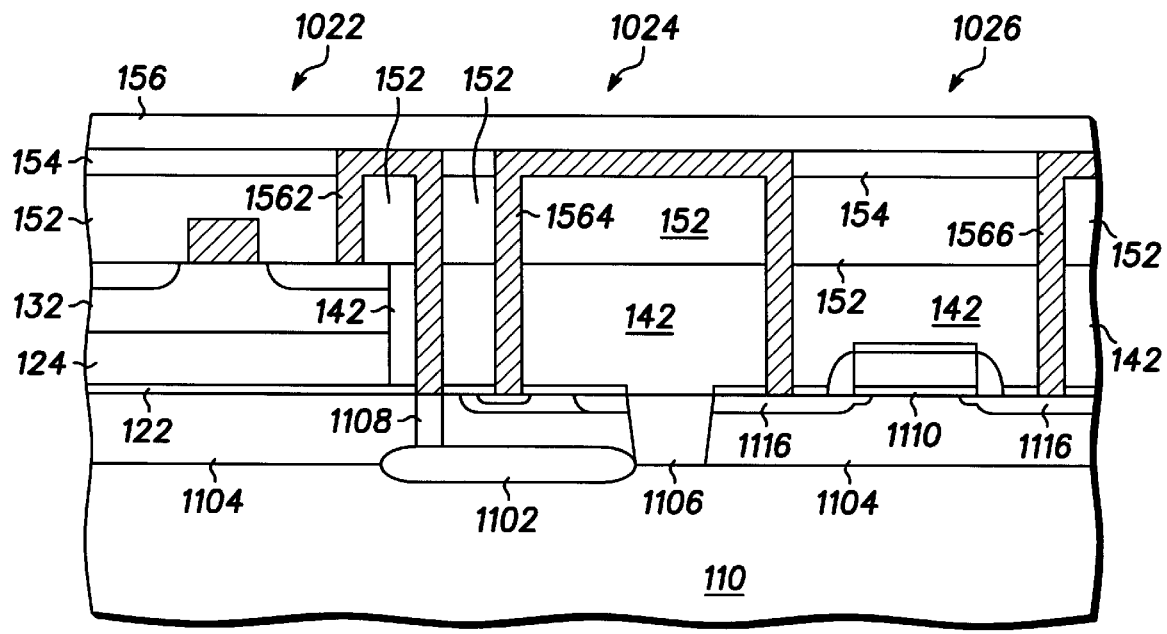

Processing continues to form a substantially completed integrated circuit 102 as illustrated in FIG. 11. An insulating layer 152 is formed over the substrate 110. The insulating layer 152 may include an etch-stop or polish-stop region that is not illustrated in the FIG. 11. A second insulating layer 154 is then formed over the first insulating layer 152. Portions of layers 154, 152, 142, 124, and 122 are removed to define contact openings where the devices are to be interconnected. Interconnect trenches are formed within insulating layer 154 to provide the lateral connections between the contacts. As illustrated in FIG. 11, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown.

A passivation layer 156 is formed over the interconnects 1562, 1564, and 1566 and insulating layer 154. Other electrical connections are made to the transistors as illustrated as well as to other electrical or electronic components within the integrated circuit 102 but are not illustrated in the figures. Further, additional insulating layers and interconnects may be formed as necessary to form the proper interconnections between the various components within the integrated circuit 102.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion into the compound semiconductor portion 1022 or the MOS portion 1024. More specifically, turning to the embodiment as described with respect to FIG. 6, the amplifiers 10248 and 10242 may be moved over to the compound semiconductor portion 1022, and the converters 10244 and 10246 can be moved over into the MOS portion 1026. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to an MOS transistor within a Group IV semiconductor region of the same integrated circuit. FIGS. 12–18 include illustrations of one embodiment.

Figure 12:
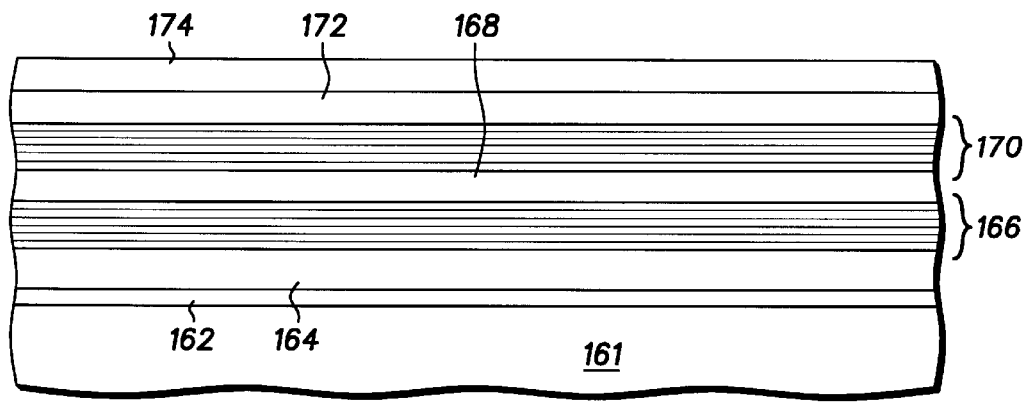
FIGS. 12–18 includes illustrations of cross-sectional views of a portion of another integrated circuit that includes a semiconductor laser and an MOS transistor.

FIG. 12 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. In this specific embodiment, the layers needed to form the optical laser will be formed first, followed by the layers needed for the MOS transistor. In FIG. 12, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. A monocrystalline Group IV semiconductor layer 174 is formed over the accommodating buffer layer 172. In one particular embodiment, the monocrystalline Group IV semiconductor layer 174 includes germanium, silicon germanium, silicon germanium carbide, or the like.

Figure 13:
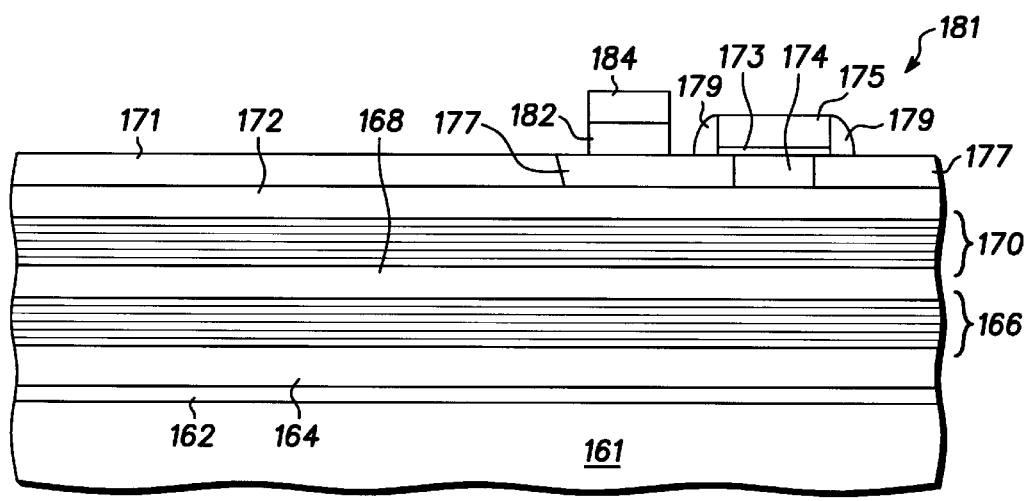

In FIG. 13, the MOS portion is processed to form electrical components within this upper monocrystalline Group IV semiconductor layer 174. As illustrated in FIG. 13, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 13. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 13.

Figure 14:
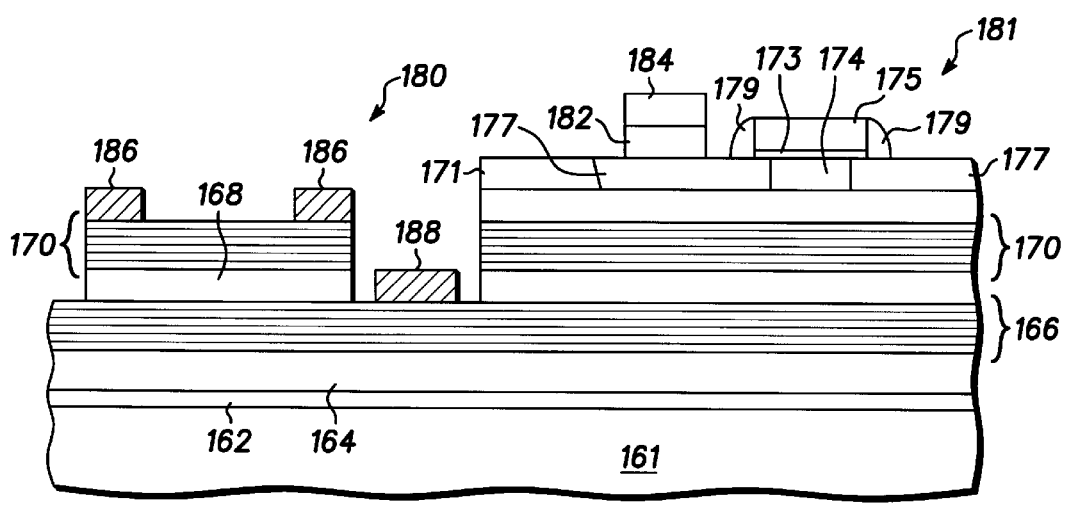

The next set of steps is performed to define the optical laser 180 as illustrated in FIG. 14. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 14. Contact 186 has an annular shape to allow light (photons) to pass out of the upper mirror layer 170 into a subsequently formed optical waveguide.

Figure 15:
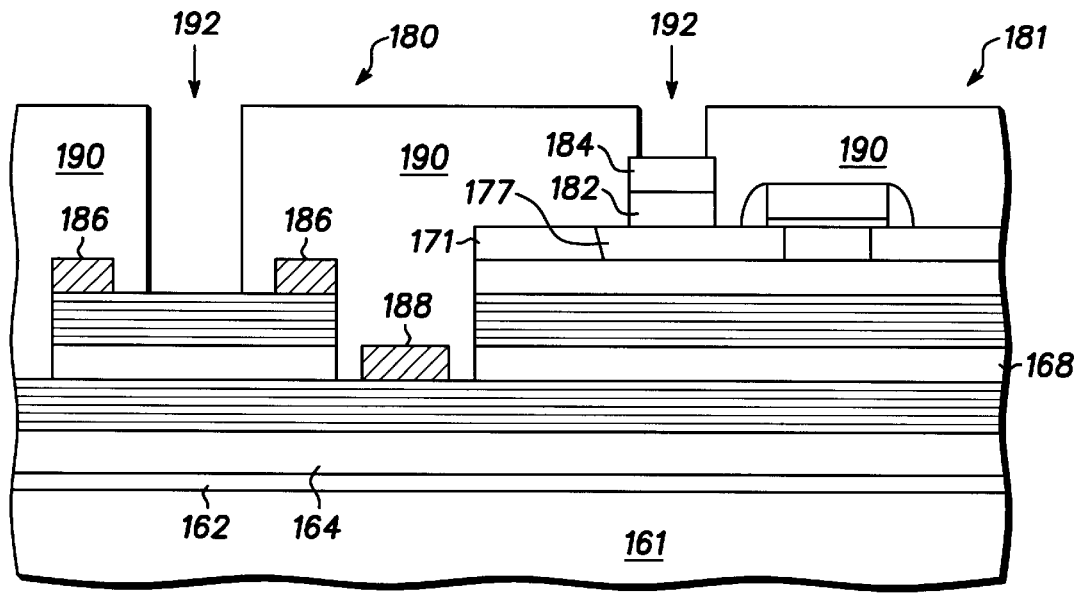
Figure 16:
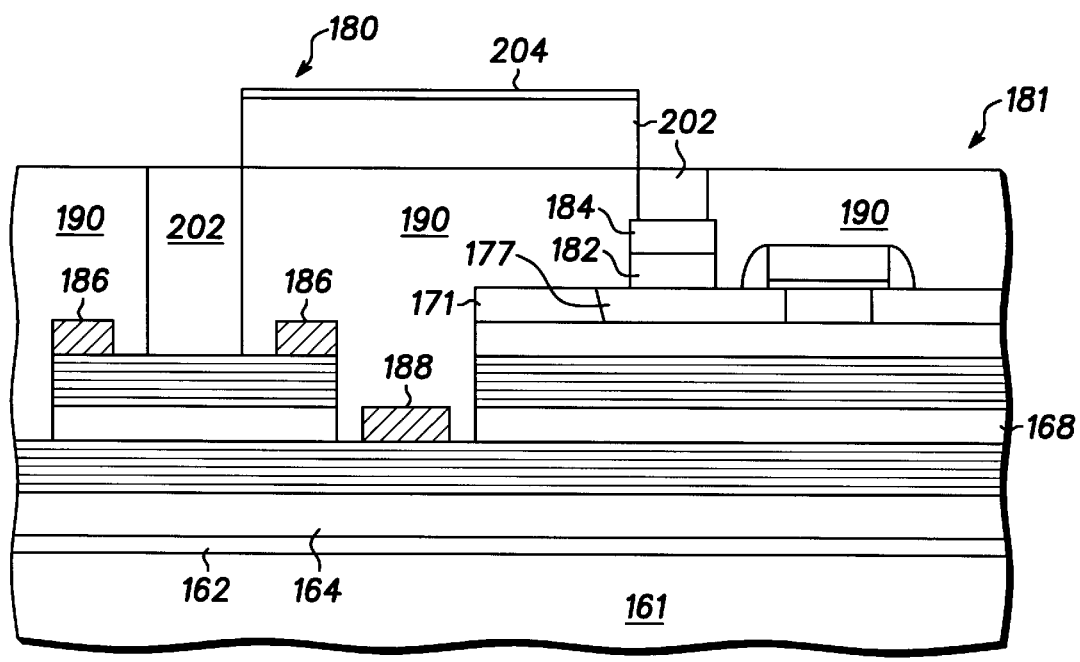

An insulating layer 190 is then formed and patterned to define optical openings extending to the contact layer 186 and one of the doped regions 177 as shown in FIG. 15. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 16. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 16.

Figure 17:
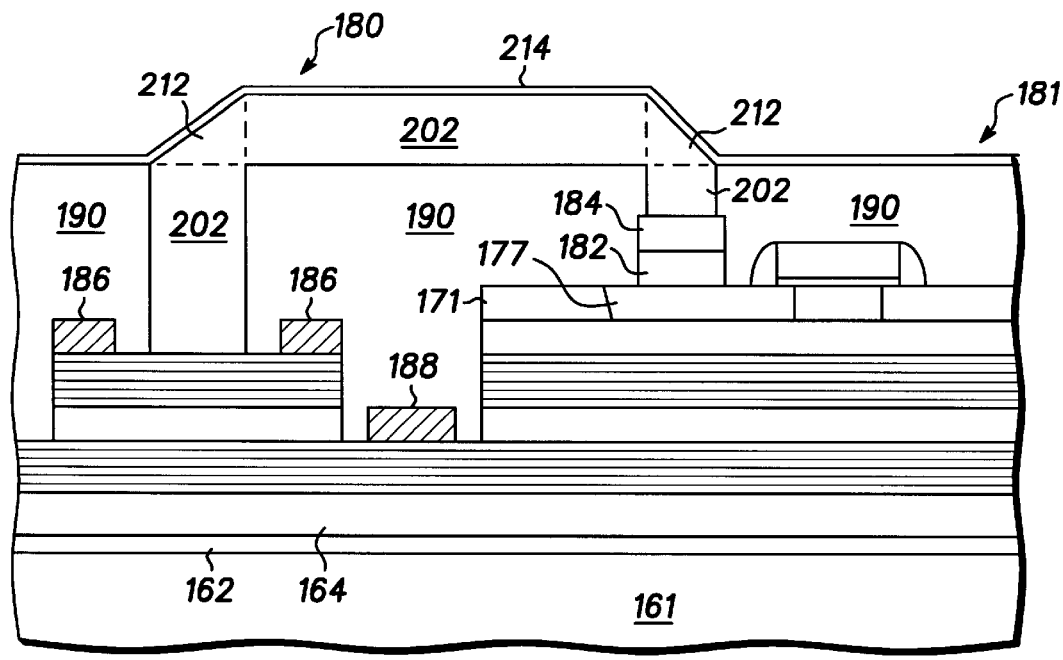

The balance of the formation of the optical waveguide, which is an optical interconnect, is completed as illustrated in FIG. 17. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 17 illustrate the border between the high refractive index materials 202 and 212. This designation is used to identify that both are made of the same material but are formed at different times.

Figure 18:
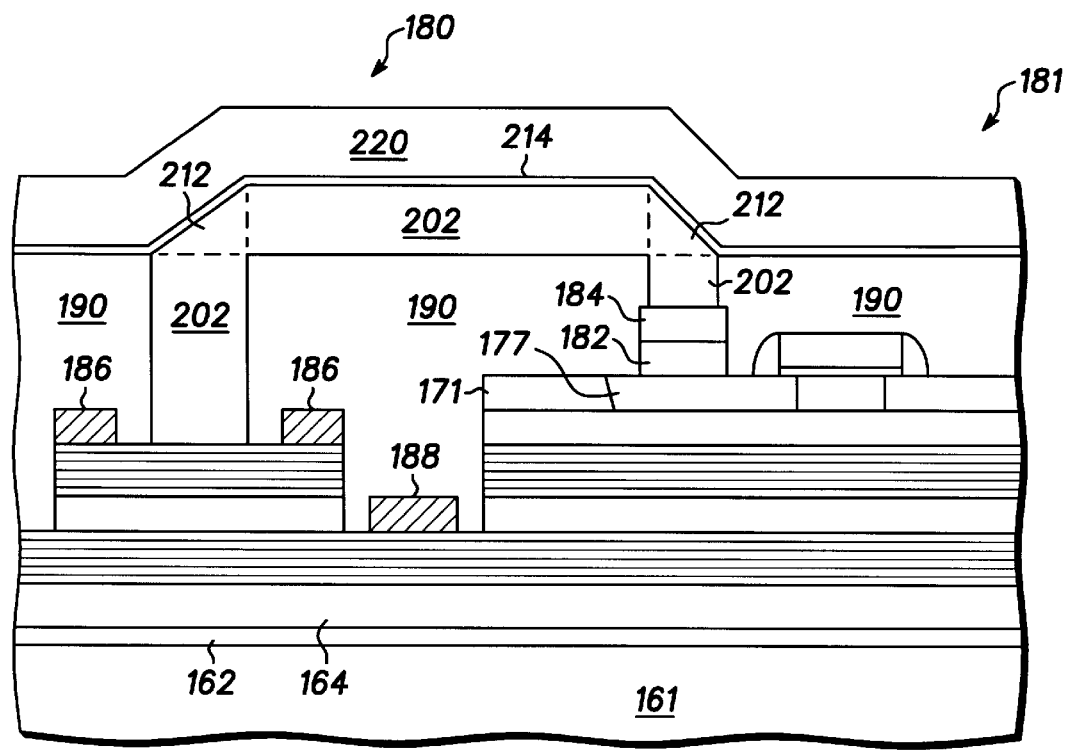

Processing is continued to form a substantially completed integrated circuit as illustrated in FIG. 18. A passivation layer 220 is then formed over the optical laser 180 and MOSFET transistor 181. Although not shown, other electrical or optical connections are made to the components within the integrated circuit but are not illustrated in FIG. 18. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate embodiments of the present invention and not limit the present invention. There are multiplicity of other combinations and other embodiments of the present invention. For example, the compound semiconductor portion may include light emitting diodes, photodetectors, diodes, or the like, and the Group IV semiconductor can include digital logic, memory arrays, and most structures that can be formed in conventional MOS integrated circuits. By using embodiments of the present invention, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor device should decrease because larger substrates can be processed more economically and more readily compared to the relatively smaller and more fragile, conventional compound semiconductor wafers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor structure, comprising:

a monocrystalline silicon substrate oriented in the (100) direction;

an amorphous layer overlying the monocrystalline silicon substrate;

a monocrystalline layer of (100) $SrTiO_3$ overlying the amorphous layer and rotated by 45 degrees with respect to the monocrystalline silicon substrate, and a monocrystalline layer of GaAs overlying the monocrystalline layer of $SrTiO_3$ and rotated by 45 degrees with respect to the monocrystalline layer of $SrTiO_3$, wherein said amorphous layer and monocrystalline layer of $SrTiO_3$ are prepared by a process comprising exposing the monocrystalline silicon substrate to strontium, titanium and oxygen while varying the partial pressure of oxygen to both 1) epitaxially grow a 2 to 100 nm thick ordered monocrystalline layer of (100) $SrTiO_3$ having a crystal orientation rotated by 45° with respect to the (100) surface of the monocrystalline silicon substrate and 2) form an amorphous silicon oxide layer overlying the silicon substrate.

2. The semiconductor structure of claim 1, wherein said structure is a wafer.

3. The semiconductor structure of claim 2, wherein said wafer has a diameter of 150–300 mm.

4. The semiconductor structure of claim 1, wherein said structure is a laser.

5. The semiconductor structure of claim 1, wherein said structure is a power amplifier.

6. The semiconductor structure of claim 1, wherein said structure is a light emitting diode.

* * * * *